US007880248B1

(12) United States Patent
Pham et al.

(10) Patent No.: US 7,880,248 B1
(45) Date of Patent: Feb. 1, 2011

(54) DESTRUCTOR INTEGRATED CIRCUIT CHIP, INTERPOSER ELECTRONIC DEVICE AND METHODS

(75) Inventors: Cuong V. Pham, San Diego, CA (US); David E. Chubin, Northridge, CA (US); Colleen L. Khalifa, Perris, CA (US)

(73) Assignee: Teledyne Technologies Incorporated, Thousand Oaks, CA (US)

( * ) Notice: Subject to any disclaimer, the term of this patent is extended or adjusted under 35 U.S.C. 154(b) by 75 days.

(21) Appl. No.: 12/368,256

(22) Filed: Feb. 9, 2009

Related U.S. Application Data

(63) Continuation-in-part of application No. 11/252,403, filed on Oct. 17, 2005, now Pat. No. 7,489,013.

(51) Int. Cl.
*G01P 15/08* (2006.01)
(52) U.S. Cl. .................. 257/417; 257/686; 257/922; 365/53

(58) Field of Classification Search ......... 257/417–419, 257/684, 685, 686, 922; 365/53
See application file for complete search history.

(56) References Cited

U.S. PATENT DOCUMENTS

| 5,053,992 A | * | 10/1991 | Gilberg et al. .......... 365/185.04 |
| 5,072,331 A | * | 12/1991 | Thiele et al. ................ 361/767 |
| 5,159,629 A | * | 10/1992 | Double et al. ............... 713/194 |

* cited by examiner

*Primary Examiner*—Leonardo Andújar
(74) *Attorney, Agent, or Firm*—K & L Gates LLP

(57) ABSTRACT

A semiconductor device. The device includes a substrate and an integrated circuit chip. The device also includes an electrically or thermally reactive layer located between a top surface of the substrate and a bottom surface of the integrated circuit chip, wherein the reactive layer is positioned such that detection of tampering causes the reactive layer to be electrically or thermally energized such that the semiconductor device is at least partially destroyed.

9 Claims, 4 Drawing Sheets

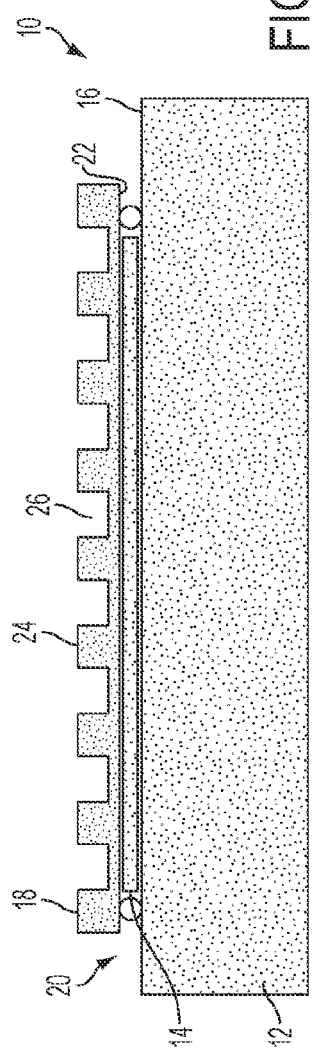
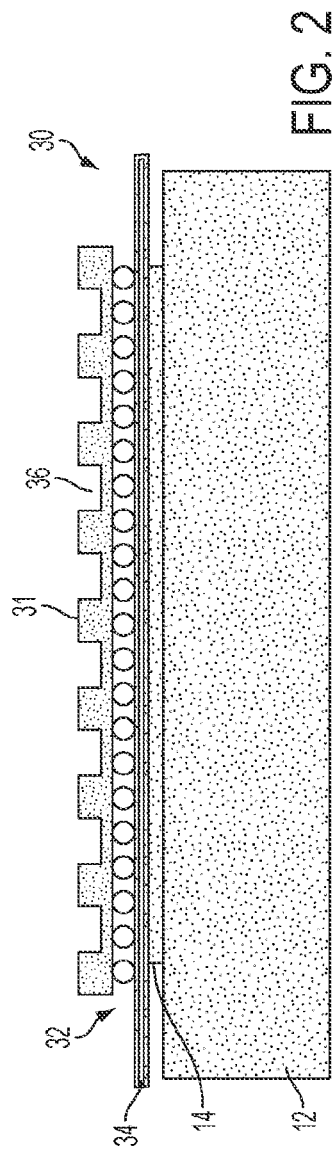
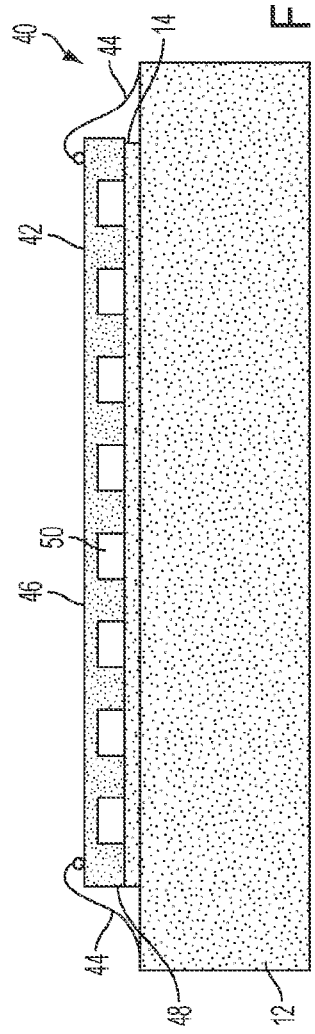

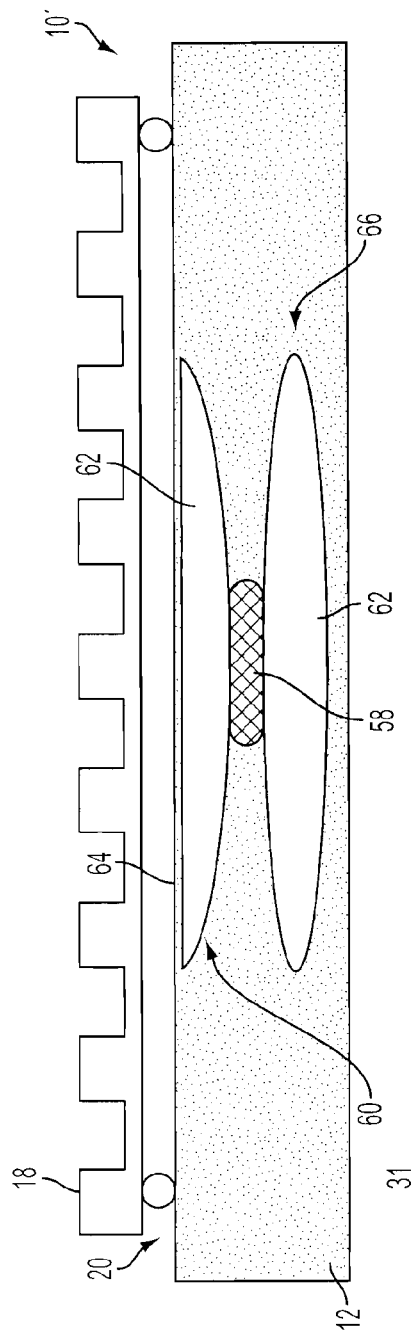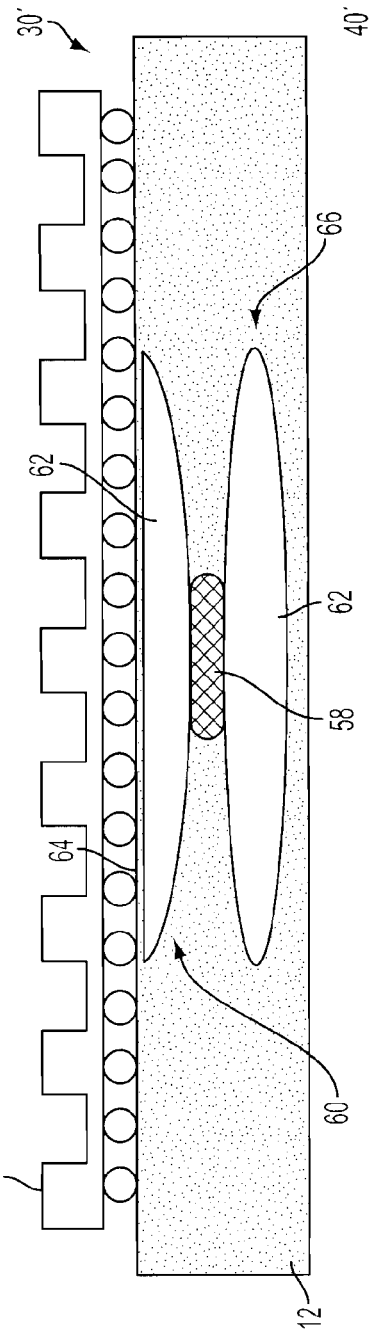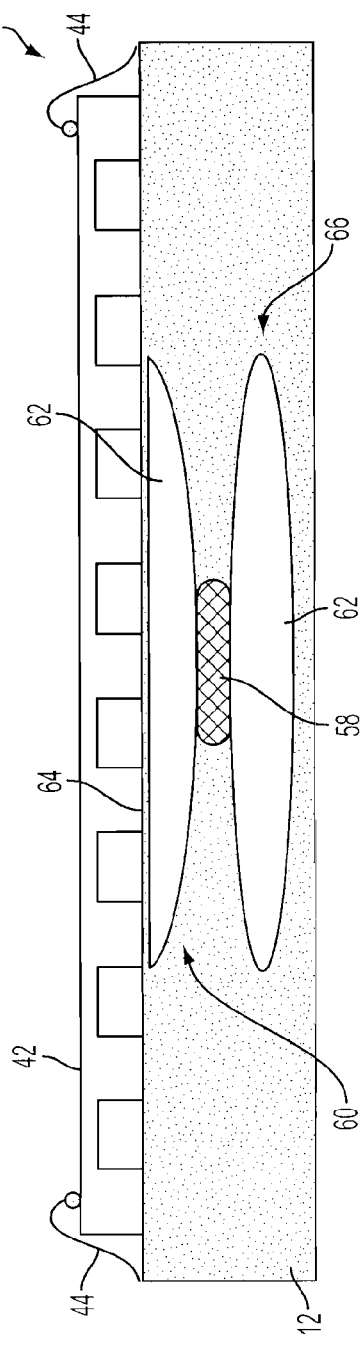

DESTRUCTOR INTEGRATED CIRCUIT CHIP, INTERPOSER ELECTRONIC DEVICE AND METHODS

REFERENCE TO PRIOR APPLICATIONS

This application is a continuation-in-part of prior application Ser. No. 11/252,403, filed Oct. 17, 2005 now U.S. Pat. No. 7,489,013.

BACKGROUND

Anti-tamper ("AT") protection is employed so that it is very difficult to reverse engineer or alter the function of electronic hardware (e.g., computer processors, integrated circuits, multi-chip modules, etc). For some commercial applications, designers often spend vast sums of money to develop a "next generation" circuit. These companies often wish to deter, or at least hamper a competitor's reverse engineering efforts. The motivation in this case is to protect valuable intellectual property. Military and Government users also have a strong interest in AT protection. When new military hardware is fielded, often the consequences of capture are not fully understood or considered by the designer of the hardware. Similarly, the combat loss of any one of a thousand pieces of sensitive, high-tech military hardware could do irreparable damage to national security.

Most AT is categorized as either passive or active. In each case, the intent is to delay, prevent or stop tampering and potential reverse engineering of an electronic circuit. Passive AT is currently the most widespread method of deterring an opponent from reverse engineering or spoofing an electronic circuit. Current passive AT arrangements include encapsulation and various types of conformal coatings such as epoxies. Methods to defeat common encapsulents are well documented.

AT standards have been defined according to the Federal Information Protection Standard (FIPS) 140-2. The standard describes the requirements for four levels of protection. For the standards for multi-chip, embedded modules, Level 1 calls for standard passivation techniques (e.g., a sealing coat applied over the chip circuitry to protect it against environmental or other physical damage). The standard describes that Level 2 can be achieved using anti-tamper coatings or passive AT. Level 3 may use passive AT if tampering will likely destroy the module. Level 4 requires the use of active AT technologies.

Layered anti-tamper arrangements are also employed in which alternating layers of passive AT with active AT yields a synergy in probing difficulty. With active AT methods, a protected circuit will take some action when unauthorized activities are detected. Any number of events can trigger a programmed circuit response. Examples of active triggering arrangements include: voltage, photon detection, acceleration, strain, thermal, chemical attack, and proximity or tamper-respondent enclosures. The response of an active AT circuit upon triggering is also widely variable. For example, zeroization may be employed in which critical memory cells or an entire die can be erased. Similarly, a response can trigger overwriting of some or all of a memory die.

SUMMARY

In one embodiment, the present invention is directed to a semiconductor device. The device includes a substrate and an integrated circuit chip. The device also includes an electrically reactive layer located between a top surface of the substrate and a bottom surface of the integrated circuit chip, wherein the reactive layer is positioned such that detection of tampering causes the reactive layer to be electrically energized such that the semiconductor device is at least partially destroyed.

In one embodiment, the present invention is directed to a semiconductor device. The device includes a substrate and an integrated circuit chip. The device also includes a thermally reactive layer located between a top surface of the substrate and a bottom surface of the integrated circuit chip, wherein the reactive layer is positioned such that detection of tampering causes the reactive layer to be thermally energized such that the semiconductor device is at least partially destroyed.

In one embodiment, the present invention is directed to a semiconductor device. The semiconductor device includes a substrate and an integrated circuit chip. The device also includes electrically reactive means located between a top surface of the substrate and a bottom surface of the integrated circuit chip, wherein the electrically reactive means is positioned such that detection of tampering causes the electrically reactive means to be electrically energized such that the semiconductor device is at least partially destroyed.

In one embodiment, the present invention is directed to a semiconductor device. The semiconductor device includes a substrate and an integrated circuit chip. The device also includes a thermally reactive means located between a top surface of the substrate and a bottom surface of the integrated circuit chip, wherein the thermally reactive means is positioned such that detection of tampering causes the thermally reactive means to be energized such that the semiconductor device is at least partially destroyed.

BRIEF DESCRIPTION OF THE FIGURES

FIGS. 1 and 6 illustrate embodiments of a cross section of a destructor electronic device employing flip chip bonding;

FIGS. 2 and 7 illustrate embodiments of a cross section of a destructor electronic device employing flip chip bonding;

FIGS. 3 and 8 illustrate embodiments of a cross section of a destructor electronic device employing wire bonding;

DESCRIPTION

Figure 4:
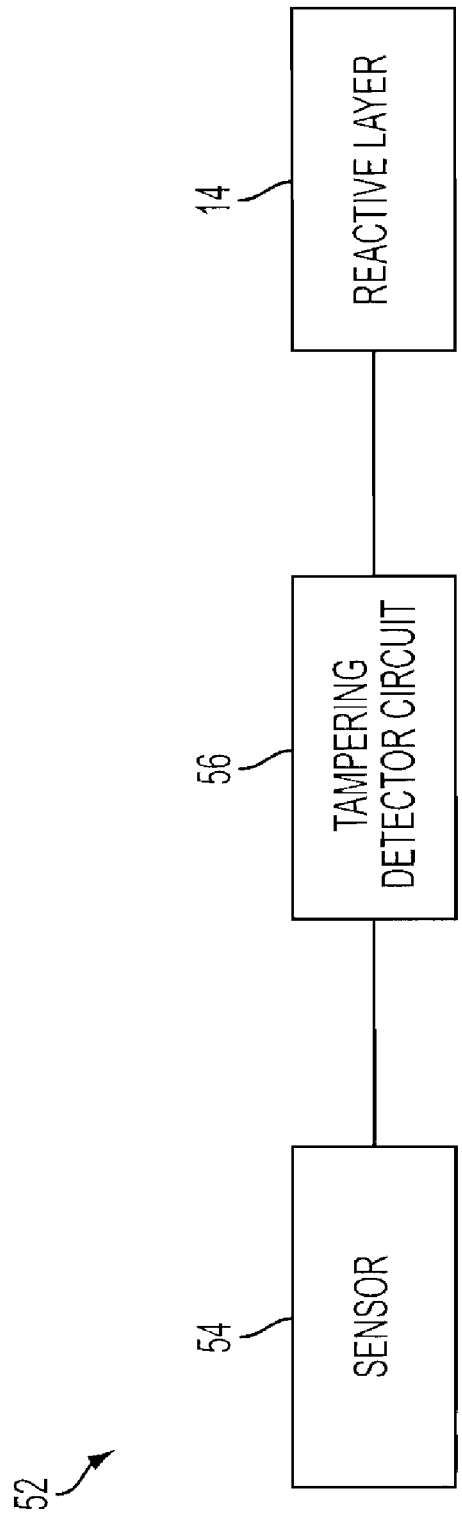
FIGS. 4 and 5 illustrate embodiments of a system for energizing an actuating material.

Various embodiments of the present invention include packages, for example, integrated circuits and multi-chip modules that include an anti-tampering feature that causes the package or a portion of the package to be damaged, deformed, and/or destroyed upon detection of tampering. In various embodiments, after tamper detection by a sensor (e.g., a passive sensor or an active sensor), an actuator such as, for example, a metal hydrate actuator, a piezoelectric actuator, a magnetostrictive actuator, a swellable polymer gel actuator, or a shape alloy memory actuator may be used to trigger or cause damage, deformation, and/or destruction of the package or a portion of the package by energizing an actuating material. In various embodiments, the actuator is a reactive material that causes damage, deformation, and/or destruction of the package or a portion of the package after detection by the sensor.

FIG. 1 illustrates embodiments of a cross section of a destructor electronic device 10 employing flip chip bonding. As seen in FIG. 1, the device 10 includes a substrate 12 (e.g., a silicon substrate) that forms the lowest layer of the device 10. A reactive layer 14 constructed of, for example, an electrically reactive material (e.g., a metallic, semi-metallic, or organic-based piezoelectric material), a thermally reactive material (e.g., a shape memory alloy such as, for example, Ti—Ni, Cu—Zn—Al, Cu—Al—Ni, an intumescent compound which swells as a result of heat exposure, such as, for example, intumescent graphite), an energetic material (e.g., metallic fulminate, azide, trinitrotoluene, HMX, RDX, pentaerythritoltetranitrate) is formed on an upper surface 16 of the substrate 12. An integrated circuit wafer, or die 18 is located such that the reactive layer 14 is positioned between the die 18 and the substrate 12. The die 18 may be positioned on the substrate 12 using solder bumps 20. The solder bumps 20 are located such that they contact the edges of the die 18, and the reactive layer 14 thus does not interfere with the electrical connections (i.e., inputs and outputs) to the die 18.

An active side 22 of the die 18 is placed such that it contacts the solder bumps 20 and the reactive layer 14. In various embodiments, a top surface 24 opposite the active surface 22 of the die 18 is scored such that voids or gaps 26 are created in the top surface 24. The scoring may be done, for example, in a crosshatch pattern, a non-adventitious pattern, or any other desired pattern. In various embodiments, the die 18 is thinned during manufacture to a thickness of, about 0.005 in. to 0.010 in. Such scoring and thinning may aid in damaging, deforming, and/or destroying the die 18 when the reactive layer 14 is energized or actuated.

In operation, if tampering is detected by a sensor (e.g., sensor 54 of FIG. 4) located on or in communication with the device 10, a signal sent to the reactive layer 14 causes the reactive layer to be electrically activated. The resultant change in volume or shape of the reactive layer 14 causes a force to be exerted on the die 18, thus causing damage, deformation, and/or destruction of the die 18.

FIG. 2 illustrates embodiments of a cross section of a destructor electronic device 30 employing flip chip bonding. In the device 30 illustrated in FIG. 2, the inputs to a die 31 require a ball grid array of solder bumps 32. An interposer 34, such as a flexible interposer (e.g., flex circuitry, a polyimide with a thin copper foil, etc.), is located between the reactive layer 14 and the die 31. Electrical connections can thus be made without interference by the reactive layer 14. In various embodiments, the die 31 is thinned during manufacture to a thickness of about 0.005 in. to 0.010 in. In various embodiments, the die 31 is scored to include voids 36.

FIG. 3 illustrates embodiments of a cross section of a destructor electronic device 40 employing wire bonding. A die 42 is attached to the substrate 12 and electrically connected to the substrate 12 through wire bonds 44. An active side 46 of the die 42 may be placed opposite a bottom surface 48 of the die 42 such that the wire bonds 44 may be attached properly. The reactive layer 14 is located between the bottom surface 48 of the die 42 and the substrate 12. In various embodiments, the bottom surface 48 of the die 42 is scored to create voids 50. In various embodiments, the die 42 is thinned during manufacture to a thickness of, for example, 0.005 in. to 0.010 in.

FIG. 4 illustrates a system 52 according to one embodiment for energizing reactive material (e.g., reactive material forming reactive layer 14) of an electronic device to be protected (such as any of the electronic devices 10, 30, 40 of FIGS. 1-3) such that the electronic device is at least partially destroyed. As shown, the system 52 comprises a sensor 54 in communication with a tampering detection circuit 56. The sensor 54 may be any type of sensor suitable for detecting one or more physical conditions indicative of tampering. Such conditions may include, for example, electrical conditions (e.g., voltage conditions, current conditions, capacitance conditions, resistance conditions), light conditions (e.g., photon detection), thermal conditions, acceleration conditions, strain conditions, and chemical conditions. In one embodiment, for example, the sensor 54 may be a tamper-respondent enclosure in the form of an anti-tamper conductive mesh disclosed in U.S. patent application Ser. No. 11/252,402 entitled METHOD FOR FORMING AN ANTI-TAMPER PATTERN, the disclosure of which in incorporated herein by reference. In such an embodiment, the mesh may cover at least one surface of the electronic device such that an attempt to access or otherwise tamper with the electronic device via the covered surface(s) breaks or disrupts lines of the mesh. The tampering detection circuit 56 may be configured to detect resulting changes in electrical properties (e.g., resistance, capacitance) of the mesh and to generate a suitable output signal that directly or indirectly causes energization of the reactive material. In other embodiments, the tampering detection circuit 56 may be configured to detect an electrical output of the sensor 54 (e.g., voltage, current) generated by the sensor 54 in response to detection of physical conditions indicative of tampering.

Figure 5:
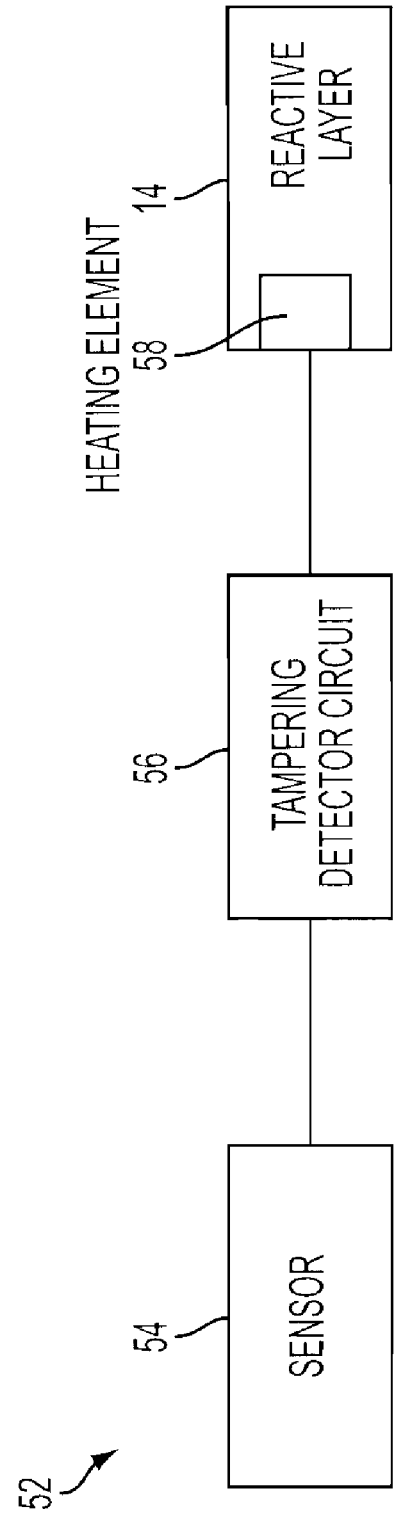

In embodiments in which the reactive material comprises an electrically reactive material (e.g., a piezoelectric material), the tampering detection circuit 56 may output a suitable electrical signal directly to the reactive material based on condition(s) detected by the sensor 54 to cause the volume or shape of the reactive material to change, resulting in at least partial destruction of the electronic device. In other embodiments, an electrical signal output by tampering detection circuit 56 may be used to indirectly energize the reactive material. As shown in FIG. 5, for example, for embodiments in which the reactive material comprises a thermally reactive material (e.g., shape memory alloy, intumescent compound), the system 52 may comprise an electrical heating element 58 (e.g., a resistive heating element) for converting an electrical signal output by the tampering detection circuit 56 into thermal energy suitable for energizing the reactive material 14. Although the heating element 58 is shown to be in contact with the reactive material in FIG. 5, it will be appreciated that in other embodiments the heating element 58 may not directly contact the reactive material. In such embodiments, thermal energy from the heating element 58 may be transmitted to the reactive material through another material (e.g., through the substrate 12).

FIGS. 6-8 illustrates embodiments of cross sections of a destructor electronic devices 10', 30', 40', respectively, each device 10', 30', 40' comprising a substrate 12 defining at least one depression 60 containing an intumescent compound 62 (e.g., intumescent graphite). In certain embodiments and as shown, the intumescent compound 62 may be retained in each depression 60 by a suitable cap 64 formed over the depression 60. In FIG. 6, a die 18 is shown mounted to the substrate 12 using solder bumps 20. In FIG. 7, a die 31 is shown mounted to the substrate using flip chip bonding, and in FIG. 8, a die 42 is shown mounted to the substrate 12 and electrically connected to the substrate 12 through wire bonds 44. Each of the electronic devices 10', 30', 40' may comprise an electrical heating element 58 in direct or indirect contact with the intumescent compound 62 such that when a suitable electrical signal is supplied to the heating element 58 (e.g., from tampering detection circuit 56), thermal energy from the heating element 58 thermally activates the intumescent compound 62, causing the intumescent compound 62 to expand from the depression(s) 60 to apply a force to the die 18, 31, 42 such that the die 18, 31, 42 is at least partially destroyed. In addition to or as an alternative to the intumescent compound 62 contained in the depression(s) 60, the substrate 12 may define one or more hollow cavities 66 containing intumescent compound 62 such that expansion of the intumescent compound 62 within each cavity 66 in response to thermal energy from the heating element 58 causes at least partial destruction of the substrate 12.

Figure 9:
FIG. 9 illustrates destruction of an electronic circuit using intumescent graphite.

FIG. 9 illustrates an electronic circuit prototype 68 that has been destroyed in accordance with one embodiment. Prior to destruction, the electronic circuit prototype 68 was mounted to substrate 70 over depression 72 defined by the substrate and containing intumescent graphite. Application of heat to the substrate 70 (and thus to the intumescent graphite) using an external heat source has resulted in expansion of the intumescent graphite and the destruction of the electronic circuit prototype 68.

It is to be understood that the figures and descriptions of embodiments of the present invention have been simplified to illustrate elements that are relevant for a clear understanding of the present invention, while eliminating, for purposes of clarity, other elements. Those of ordinary skill in the art will recognize, however, that these and other elements may be desirable for practice of various aspects of the present embodiments. However, because such elements are well known in the art, and because they do not facilitate a better understanding of the present invention, a discussion of such elements is not provided herein.

It can be appreciated that, in some embodiments of the present methods and systems disclosed herein, a single component can be replaced by multiple components, and multiple components replaced by a single component, to perform a given function or functions. Except where such substitution would not be operative to practice the present methods and systems, such substitution is within the scope of the present invention.

Examples presented herein, including operational examples, are intended to illustrate potential implementations of the present method and system embodiments. It can be appreciated that such examples are intended primarily for purposes of illustration. No particular aspect or aspects of the example method, product, computer-readable media, and/or system embodiments described herein are intended to limit the scope of the present invention.

It should be appreciated that figures presented herein are intended for illustrative purposes and are not intended as construction drawings. Omitted details and modifications or alternative embodiments are within the purview of persons of ordinary skill in the art. Furthermore, whereas particular embodiments of the invention have been described herein for the purpose of illustrating the invention and not for the purpose of limiting the same, it will be appreciated by those of ordinary skill in the art that numerous variations of the details, materials and arrangement of parts/elements/steps/functions may be made within the principle and scope of the invention without departing from the invention as described in the appended claims.

What is claimed is:

1. A semiconductor device, comprising:
    a substrate;
    an integrated circuit chip; and
    an actuator comprising an intumescent compound, the actuator positioned between a top surface of the substrate and a bottom surface of the integrated circuit chip to at least partially destroy the integrated circuit chip upon detection of tampering.

2. The semiconductor device of claim 1, wherein the integrated circuit chip includes a top surface having a plurality of voids.

3. The semiconductor device of claim 2, wherein the voids are arranged in a crosshatch pattern.

4. The semiconductor device of claim 2, wherein the voids are arranged in a non-adventitious arrangement.

5. The semiconductor device of claim 1, further comprising a flexible interposer located between the actuator and the integrated circuit chip.

6. The semiconductor device of claim 5, wherein the flexible interposer includes a flexible polymeric layer and one of a metallic conductive layer and a non-metallic conductive layer.

7. The semiconductor device of claim 1, wherein the integrated circuit chip has a thickness of approximately 0.005 in. to 0.010 in.

8. The semiconductor device of claim 1, wherein the bottom surface of the integrated circuit chip is an active surface.

9. The semiconductor device of claim 1, wherein the integrated circuit chip is in electrical communication with the substrate using at least one of flip chip bonding and wire bonding.

* * * * *